United States Patent [19]

Krivy

[11] Patent Number: 6,023,172
[45] Date of Patent: Feb. 8, 2000

[54] LIGHT-BASED METHOD AND APPARATUS FOR MAINTAINING PROBE CARDS

[75] Inventor: Andrew Krivy, Boise, Id.

[73] Assignee: Micron Technology, Inc., Boise, Id.

[21] Appl. No.: 08/992,599

[22] Filed: Dec. 17, 1997

[51] Int. Cl.⁷ .................................................. G01R 31/00
[52] U.S. Cl. ......................... 324/756; 324/754; 324/758
[58] Field of Search .................................... 324/756, 754, 324/755, 765

[56] References Cited

U.S. PATENT DOCUMENTS

| | | | |
|---|---|---|---|
| 4,777,146 | 10/1988 | Bylsma et al. ....................... | 324/765 X |
| 5,208,641 | 5/1993 | Mocker et al. ............................. | 356/5 |
| 5,404,021 | 4/1995 | Mangano et al. ....................... | 250/561 |
| 5,666,063 | 9/1997 | Abercrombie et al. .................. | 324/754 |
| 5,735,276 | 4/1998 | Lemelson ............................. | 128/653.1 |

Primary Examiner—Josie Ballato
Assistant Examiner—T. R. Sundaram
Attorney, Agent, or Firm—Dorsey & Whitney LLP

[57] ABSTRACT

A probe card analyzer includes a table or jig for securing a probe card, a light source for producing at least a first beam of collimated light, and at least a first positioning mechanism for positioning the first beam at a predefined desired probe tip location. A second beam of collimated light and a second positioning mechanism may be provided for positioning the second beam such that it intersects the first beam at the desired probe tip location for visually identifying the desired probe tip location. The first and the second beams may be successively adjusted through a set of desired probe tip location coordinates, the position of each of a set of probe tips being adjusted to the respective desired probe tip location, to which point the probe tip may be adjusted.

29 Claims, 4 Drawing Sheets

LIGHT-BASED METHOD AND APPARATUS FOR MAINTAINING PROBE CARDS

TECHNICAL FIELD

This invention relates to probe cards for testing microelectronic devices, and more particularly, to analyzers for testing, adjusting and maintaining probe cards used in testing microelectronic devices.

BACKGROUND OF THE INVENTION

A probe card is a device used to couple signals to and from bonding pads of integrated circuits during testing before the integrated circuits have been packaged. With reference to FIGS. 1–3, the probe card 10 includes a printed circuit board 12, a mounting shelf 14 formed of an insulative material, such as epoxy, and two sets of probe needles 16a, b supported by the mounting shelf 14. The probe needles 16a, b in each set extend inwardly toward each other beneath an aperture 18 formed in the printed circuit board 12. Each of the probe needles 16 terminate in respective tips 20 that are adapted to make contact with respective bonding pads of an integrated circuit (not shown) during testing. The end of each probe needle 16 opposite its tip 20 is connected to a respective contact terminal 22 by an electrical trace 23 that is adapted to be coupled to a test equipment (not shown).

For the probe card to be effective, the precise position of the tip 20 of each needle 16 must be adjusted in three-dimensions to be within some predefined tolerance of a respective desired tip location. The predefined tolerances are very tight due to the extremely small feature sizes of microelectronic devices. The current techniques for adjusting the position of the tip 20 involve a long, detailed, time consuming, and error prone process. In the current method, the probe card 10 is first mounted on a support plate of a clamshell-shaped motherboard fixture (not shown). The probe card 10 is secured in place by a retaining plate which is pivotally mounted to the support plate. The downward pressure of the retaining plate flexes the probe needles 16 in a similar fashion to the way the probe needles 16 are flexed when used in testing microelectronic devices. The probe card 10 is mounted in the motherboard fixture (not shown) with the probe needles 16 facing inward such that the probe needles are proximate to a chuck driven inspection plate (not shown) within the motherboard fixture. The inspection plate includes a pair of concave windows and a pair of isolation dots. The inspection plate is positionable in three-dimensional space with respect to the probe needles. The chuck driven inspection plate is capable of producing a visual feedback of the two-dimensional position of a needle tip 20 with respect to a desired tip location. The inspection plate can apply mechanical force to the probe needles 16 which simulates the mechanical force applied to the probe needles when the probe needles are used to inspect a microelectronic device. The inspection plate is also capable of providing feedback related to the third dimension of the position of the needle tip 20 with respect to the desired tip location. This is accomplished by detecting the completion of an electrical circuit which is defined by the physical contact between the probe needle tip and an electrical contact formed at the isolation dot on the inspection plate.

The adjustment and maintenance of probe cards 10 currently requires a highly skilled technician, who adjusts the position of each needle tip 20 on a trial-and-error basis. Since the probe card 10 is generally mounted in the motherboard fixture with its probe needles 16 facing inwardly, the technician must view and manipulate the probe needles 16 through an aperture 18 formed in the printed circuit board 12, manually adjusting the position of each needle tip 20 with a pair of tweezers or the like. After adjusting the position of several needle tips 20, the accuracy of the adjustments must be ascertained with the inspection plate. The inspection plate is positioned proximate the probe card 10 to determine whether each of the adjusted tips is within the predefined tolerance of its desired location. The inspection system displays on a monitor (not shown) the two dimensional position of each of the needle tips 20 relative to its respective desired tip location. Third dimension information is communicated by an indication of whether a circuit has been completed. After viewing the results, the inspection plate is positioned away from the probe card 10 to allow the technician to continue adjusting the tip positions. A highly skilled technician may take upwards of five tries to position a needle tip 20 within the predefined tolerance. Each time the needle tips are manually adjusted, the inspection plate must be positioned proximate the probe card 10 to retest the tip position. Adjusting the needles 16 through the aperture 18 in the printed circuit board 12 is quite awkward. It can take a skilled technician several hours to adjust the positions of all the needle tips 20 on a single probe card 10.

Use of the probe card 10 during testing microelectronic devices causes the needle tips 20 to move out of their desired tip locations. Therefore, the adjustment procedure must be performed continually over the life of the probe card. This requires the use of highly-skilled technicians and requires a great deal of time and effort to be spent on maintaining the probe card.

SUMMARY OF THE INVENTION

A light-based probe card analyzer and method of adjusting tip locations using the light-based probe card analyzer is disclosed in the exemplary embodiments of this invention. The light-based probe card analyzer includes a motherboard, table or jig for mounting the probe card, a light source for producing at least a first beam of collimated light and a first beam position adjusting mechanism for selectively adjusting a position of the first beam of collimated light relative to the motherboard, table or jig.

In a first exemplary embodiment, the light source comprises a laser light source for producing a collimated beam of laser light. A beam splitter is positioned to split the laser beam into a first laser beam and a second laser beam. A first motor actuated reflector is positioned in the path of the first laser beam for adjusting the position of the first laser beam along a first axis. A second motor actuated reflector is positioned in the reflected path of the first laser beam for adjusting the position of the first laser beam along a second axis which is perpendicular to the first axis. A third motor actuated reflector is positioned in the path of the second laser beam for adjusting the position of the second laser beam along the first axis. A fourth motor actuated reflector is positioned in the reflected path of the second laser beam for adjusting the position of the second laser beam along a third axis which is perpendicular to the first and second axes. Each of the motor actuated reflectors is controlled through a respective stepper motor by a controller which may receive a set of predefined desired needle tip locations. The position of the first and the second laser beams may thereby be automatically adjusted to a series of predefined desired needle tip locations, the intersection of the laser beams successively defining a visual point in space at each of the desired needle tip locations.

In a second exemplary embodiment, a pair of light sources provide a first and second light beam directed toward the jig.

A pair of templates, each positioned in the path of one of the respective light beams is provided. The templates each have at least one aperture defined therethrough, the apertures positioned in the templates such that a portion of the respective light beam passing through the aperture will pass through one of the desired needle tip locations. The respective light beams thus intersect at the desired needle tip location. Multiple apertures may be provided for marking multiple desired needle tip locations.

Since the inspection plate is not employed, the probe card may be mounted upside down in the jig, such that the needle tips are facing outward. This allows the technician better access to the needle tips. The technician may adjust the needle tip toward the desired needle tip location identified by the intersection of the two collimated light beams using the tweezers. Since the desired location is visually identified in three-dimensional space, the technician may directly adjust the needle tip to the desired location without iterating through the time-consuming, trial and error process. The visual feedback to the technician is direct, and not supplied through a monitor, thereby easing the technician's job and eliminating costly equipment. Also the visual feedback is instantaneous, not requiring the inspection system to be employed after each series of adjustments.

In an exemplary embodiment of the method of the invention, a probe card is mounted in a jig, and a first and second laser beam are supplied. The position of the first and second laser beam are successively adjusted such that the first and second laser beam intersect at a successive series of desired needle tip locations. Each time that a desired needle tip location is visually identified by the intersection of the laser beams, the technician manually adjusts the position of the needle tip to within the predetermined tolerance of that desired needle tip location.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known structures associated with probe cards, probe card analyzers, lasers and optical assemblies for lasers, such as lens, filters and reflectors, have not been shown in detail in order to avoid unnecessarily obscuring the description of the embodiments of the invention.

Figure 1:
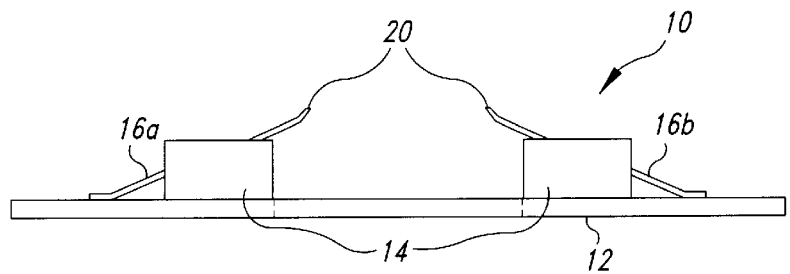
FIG. 1 is a front elevational view of a conventional probe card.
Figure 2:
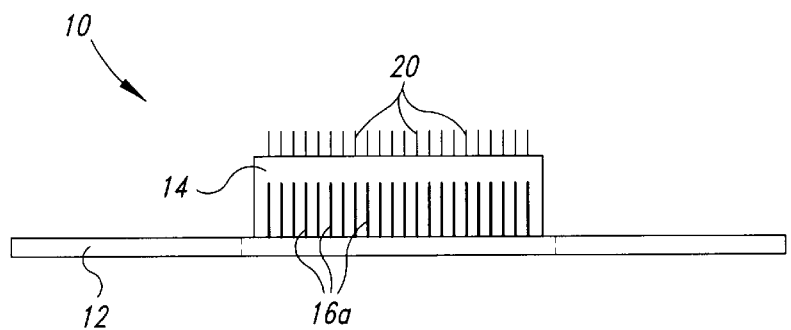
FIG. 2 is a side elevational view of the probe card of FIG. 1.
Figure 3:
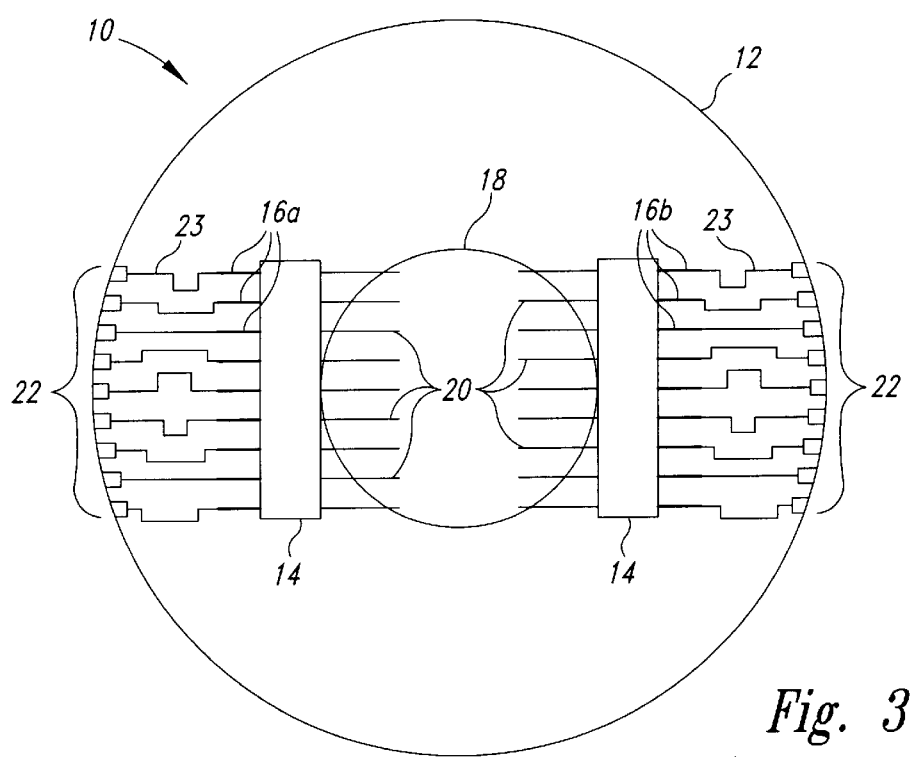
FIG. 3 is a top plan view of the probe card of FIGS. 1 and 2.
Figure 4:
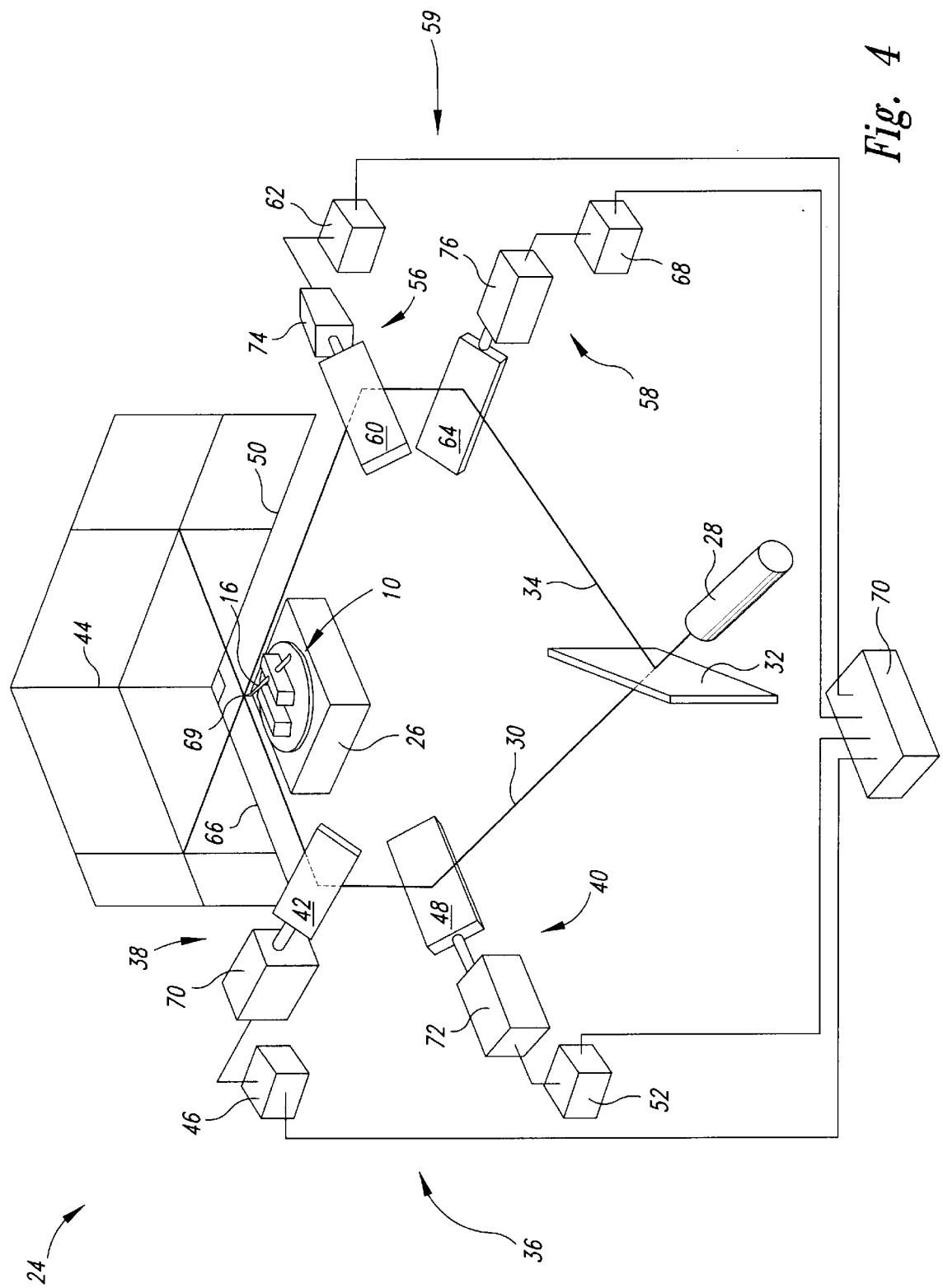
FIG. 4 is an isometric view of an exemplary embodiment of a light-based probe card analyzer in accordance with the invention, with a single probe card needle shown.

With reference to FIG. 4, a first exemplary embodiment of the light-based probe card analyzer 24 is shown. The probe card analyzer 24 includes a motherboard, table or jig 26 for securely mounting the probe card 10 therein. The probe card 10 is mounted such that the needles 16 of the probe card 10 face outwardly from the jig 26 to permit easy access thereto by the technician. The jig 26 should be designed to apply forces to the probe card 10 and the probe needles 16 which are similar to the forces applied to the probe card 10 and probe needles 16 during the actual testing of microelectronic devices so as to account for the geometrical changes associated with the flexing of the probe card 10 and probe needles 16 under the applied forces.

A source of collimated light, such as a laser light source 28 is provided for supplying at least a first collimated beam of light, such as first laser beam 30. A beam of collimated light is employed since a high degree of accuracy is required by the application. The collimated light beam should preferably be visible to the unaided eye. Depending on the working environment, this may require the introduction of particulate matter, such as smoke or titanium powder, into the ambient environment. A helium neon laser is suitable for producing the collimated beam of light. Other lasers, such as ion lasers, diode lasers and neodymium lasers would also be suitable. Conventional optics such as lens, filters and reflectors, may be provided to shape, focus and direct the light beam as desired. The first laser beam 30 strikes a beam splitter 32 passing a portion of the first laser beam 30 onward and reflecting a portion of the first laser beam 30 as a second laser beam 34. The collimated beams may be provided as a planar sheet and a linear vector, as two linear vectors, or as two planar sheets, depending on the desired character of the intersection of the beams, such as a point or a line.

A first light beam position adjusting mechanism 36 is provided for adjusting the position of the first laser beam 30 in two dimensions. The first light beam position adjusting mechanism 36 includes a first motor actuated reflector 38 and a second motor actuated reflector 40. The first motor actuated reflector 38 includes a pivotally positionable first reflector 42, capable of positioning the first laser beam along a first axis 44. The first reflector 42 is positioned by a stepping motor 70 under control of a motor controller 46. The second motor actuated reflector 40 includes a second reflector 48 which is pivotally positionable to adjust the position of the first laser beam 30 along a second axis 50. The second reflector 48 is positioned by a stepping motor 72 under control of a motor controller 52.

The second light beam position adjusting mechanism 54 includes a third motor actuated reflector 56 and a fourth motor actuated reflector 58. The third motor actuated reflector 56 has a third reflector 60 which is pivotally positionable to position the second laser beam 34 along the first axis 44. The third reflector 60 is positioned by a stepping motor 74 under control of a motor controller 62. The fourth motor actuated reflector 58 includes a fourth reflector 64 which is pivotally positionable to adjust the position of the second laser beam 34 along a third axis 66. The fourth reflector 64 is positioned by stepping motor 76 under control of a motor controller 68.

The motor controllers 46, 52, 62, 68 may each be controlled by a general purpose computer 70. The general purpose computer 70 may be programmed with a set of three-dimensional position data representing the desired needle tip locations. The general purpose computer 70 may then adjust the positions of the first and second laser beams through each of the desired needle tip locations.

Figure 5:
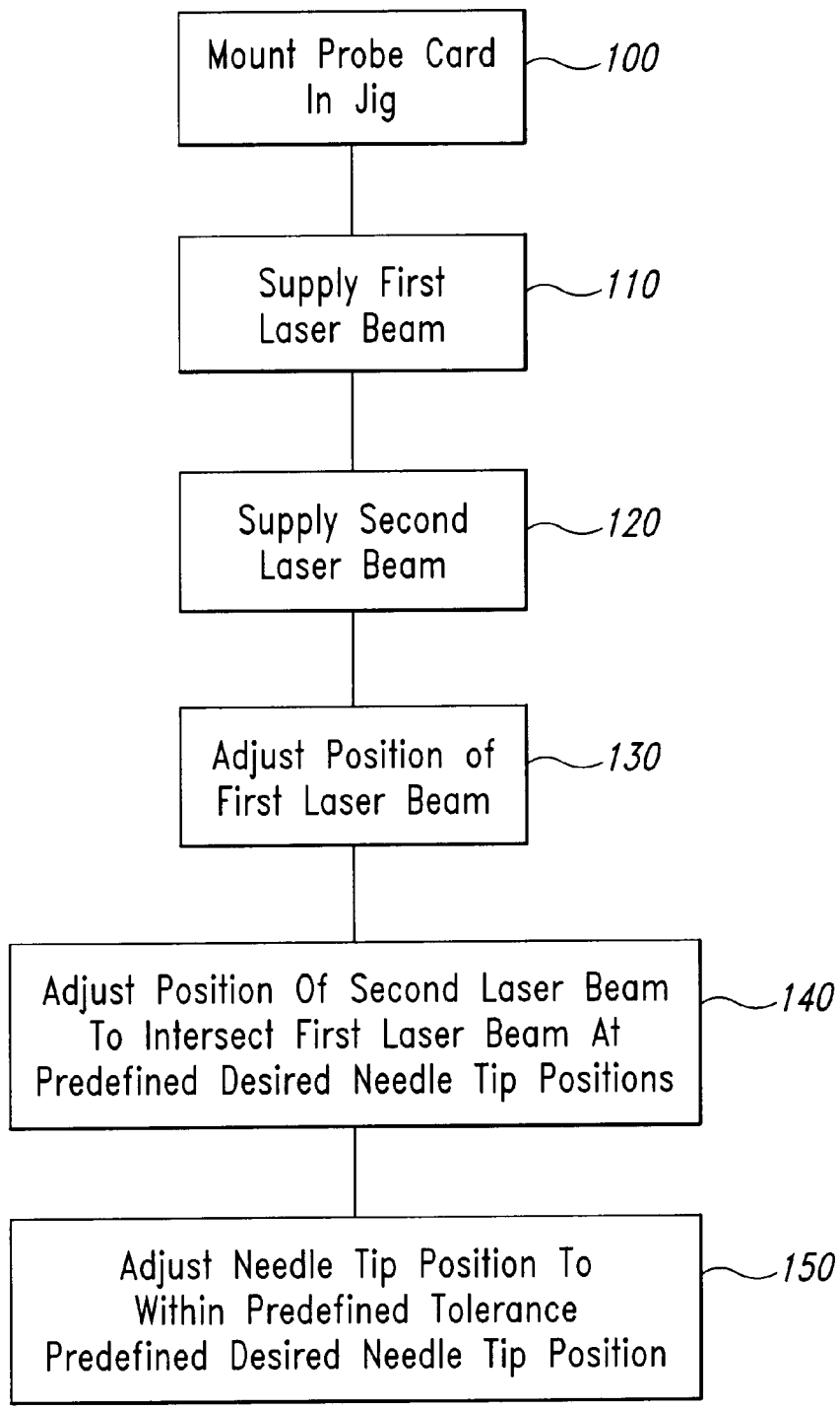
FIG. 5 is a flow diagram of an exemplary method of adjusting the positions of probe needle tips using the probe card analyzer of FIG. 4.

An exemplary method of adjusting the needle tip positions using the light-based probe card analyzer will be discussed with reference to FIGS. 4 and 5. The probe card 10 is mounted in jig 26, as mentioned above (step 100). Under the control of the general purpose computer 70, the position of the first laser beam 30 along the first axis 44 is adjusted to a first coordinate of a first predefined desired needle tip location (step 130). The position of the first laser beam 30 is also adjusted along the second axis 50 to a second coordinate of the first predefined needle tip location. The position of the second laser beam 34 is adjusted along the first axis 44 to a first coordinate of the first predefined desired needle tip location (step 140). Finally, the position of the second laser beam 34 is adjusted along the third axis 66 to a third coordinate of the desired needle tip location. Each vector of laser light 30, 34 is adjusted in two coordinates, causing the vectors of laser light 30, 34 to share an identical first coordinate ensuring that a single point of intersection 69 can occur at the desired tip location. The technician then manually adjusts the tip 20 of the needle 16 directly toward the intersection 69 of the first laser beam 30 and the second laser beam 34 (step 150). The technician determines whether the tip 20 is at the desired location by visual inspection, ensuring that the tip 20 intersects the intersection 69. Once tip 20 of the first needle 16 is adjusted to within the predetermined tolerance of the desired tip location, the position of the laser beams 30, 34 are successively iterated through the desired needle tip locations, each time the technician manually adjusting the position of needle tip 20 to the desired tip location.

The accuracy of the system is principally determined by the accuracy of the stepping motors 70, 72, 74, 76, any associated system of gears (not shown) which are used to drive the reflectors 42, 48, 60 and 62 and the diameter of the laser beams 30, 34. The shape and length of the laser cavity and the nature of the resonator optics generally determine the beam diameter and divergence.

Figure 6:
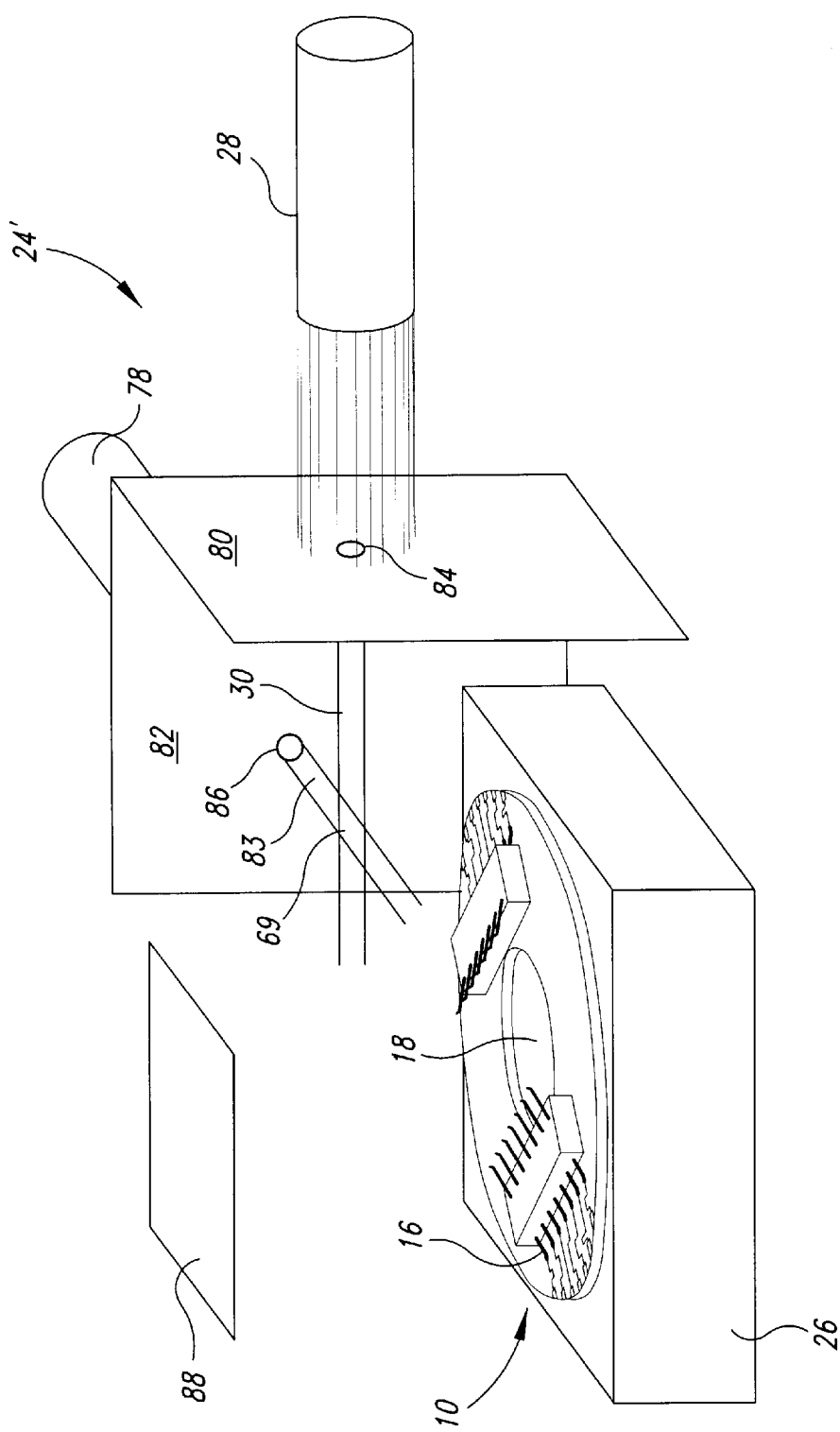
FIG. 6 is a perspective view of a second exemplary embodiment of the light-based probe card analyzer.

A second exemplary embodiment of the light-based probe card analyzer 24' will be discussed with reference to FIG. 6. The probe card analyzer 24' includes the jig 26 and the light source 28, as well as, a second light source 78, a first template 80 and a second template 82. The second light source produces a second beam of light 83, which is preferably perpendicular to the first beam of light 30. The first template 80 is positioned between the first light source 28 and the jig 26. Likewise, the second template 82 is positioned between the second light source and the jig 26. At least one aperture 84 is formed in the first template 80 such that a portion of the first beam of light 30 passing through the aperture 84 will pass through the desired needle tip location. At least one aperture 86 is formed in the second template 82 such that a portion of the second beam of light 83 passing through the aperture 86 will intersect with the first beam of light 30 at the desired needle tip location. The templates 80, 82 may have additional apertures formed therethrough for acting as first light positioning and second light positioning mechanisms, respectively. In addition, an electrical contact plate 88 may be provided for determining whether the electrical connections between the needle tip 18 and contacts 22 formed on the printed circuit board 12 are functional, to determine contact resistance measurements.

Although specific embodiments of the light-based probe card analyzer, and methods for analyzing and maintaining probe cards using the light-based probe card analyzer, according to the present invention are described herein for illustrative purposes, various equivalent modifications can be made without departing from the spirit and scope of the invention, as will be recognized by those skilled in the relevant art. For example, although the embodiment of FIG. 4 uses a single light source that is redirected by motor controlled reflectors, it will be understood that multiple light sources may be used. Also, components other than reflectors and/or precision motors may be used. Thus any mechanism that is capable of generating at least one precisely controlled beam may be used. The teachings provided herein of the present invention can be applied to other light-based probe card analyzers, not necessarily the exemplary laser probe card analyzer generally described above.

These and other changes can be made to the invention in light of the above-detailed description. In general, in the following claims, the terms used should not be construed to limit the invention to the specific embodiments disclosed in the specification and the claims, but should be construed to include all light-based probe card analyzers that operate in accordance with the claims and to methods of analyzing a probe card with such light-based probe card analyzers. Accordingly, the invention is not limited by the disclosure, but instead its scope is to be determined entirely by the following claims.

I claim:

1. A method of adjusting a location of a tip of a needle on a probe card, the method comprising:

mounting the probe card in a jig;

supplying a first beam of collimated light passing through a first predetermined location; and adjusting the position of the needle until the tip of the needle is within a predetermined tolerance of the first predetermined location identified by the first beam of collimated light.

2. The method of claim 1, wherein supplying a first beam of collimated light includes supplying a first beam of laser light and directing the first beam of laser light through the first predetermined location.

3. The method of claim 1, further comprising:

supplying a second beam of collimated light passing through the first predetermined location, such that the second beam of collimated light intersects the first beam of collimated light at the first predetermined location.

4. The method of claim 3, wherein supplying a second beam of collimated light includes supplying a second beam of laser light and directing the second beam of laser light through the first predetermined location.

5. The method of claim 3, wherein supplying a first beam of collimated light includes supplying a first beam of laser light and wherein supplying a second beam of collimated light includes passing the first laser beam through a beam splitter.

6. The method of claim 5, wherein supplying a second beam of collimated light includes supplying the second beam of collimated light as a two dimensional planar sheet.

7. The method of claim 5, wherein supplying a second beam of collimated light includes supplying the second beam of collimated light as a substantially one dimensional vector.

8. The method of claim 1, wherein supplying a first beam of collimated light includes supplying the first beam of collimated light as a substantially one dimensional vector, and wherein supplying a second beam of collimated light includes supplying the second beam of collimated light as a substantially one dimensional vector.

9. A method of adjusting a position of a tip of each of a set of needles on a probe card, the method comprising:

mounting the probe card in a jig;

supplying a first beam of collimated light;

supplying a second beam of collimated light;

successively adjusting a position of the first beam and successively adjusting a position of the second beam such that the first beam intersects the second beam at a set of predefined desired needle tip positions; and successively adjusting each of the needles in the set of needles on the probe card such that the tip of each of the needles is within a predefined tolerance of a respective one of the set of predefined desired needle tip positions.

10. The method of claim 9, wherein supplying a first beam of collimated light and supplying a second beam of collimated light includes supplying a laser beam; and splitting the laser beam into a first laser beam and a second laser beam.

11. A method of analyzing a location of a tip of a needle on a probe card, the method comprising:

mounting the probe card in a jig;

supplying a first beam of collimated light;

selectively adjusting a position of the first beam of collimated light along an at least first axis to a first predefined position representing at least a first coordinate of a desired position of the needle tip; and determining if the first beam of collimated light intersects the needle tip of the probe card.

12. The method of claim 11, further comprising:

supplying a second beam of collimated light;

selectively adjusting a position of the second beam of collimated light along an at least second axis to a second predefined position representing at least a second coordinate of the desired position of the needle tip, such that the second beam of collimated light intersects with the first beam of collimated light at a point; and determining if the tip of the probe card needle intersects the point.

13. An apparatus for analyzing the location of a tip of a needle on a probe card, the apparatus comprising:

a table for mounting the probe card;

a light source, the light source producing at least a first beam of collimated light; and a first light beam position adjusting mechanism arranged to selectively adjust a position of the first light beam along at least a first axis relative to the probe card such that the first light beam passes through at least a first coordinate of a desired tip location.

14. The apparatus of claim 13, wherein the first light beam position adjusting mechanism is arranged to selectively adjust the position of the first light beam along a second axis relative to the probe card such that the first light beam passes through at least a second coordinate of the desired tip location.

15. The apparatus of claim 14, further comprising an automated control mechanism in controlling communication with the first light beam position adjusting mechanism.

16. The apparatus of claim 13, wherein the first beam of collimated light is a laser light beam.

17. The apparatus of claim 13, wherein the first beam is formed as a substantially planar sheet of collimated light.

18. The apparatus of claim 13, wherein the first beam is formed as a substantially linear vector of collimated light.

19. The apparatus of claim 13, further comprising a second beam of collimated light, the second beam of collimated light positionable with respect to the first beam of collimated light to intersect the first beam of collimated light at the desired tip location.

20. The apparatus of claim 19, wherein the second beam of collimated light is a laser light beam.

21. The apparatus of claim 19, wherein the second beam is formed as a substantially linear vector of collimated light.

22. The apparatus of claim 19, further comprising a second light beam position adjusting mechanism arranged to selectively adjust a position of the second beam along at least a first axis relative to the probe card such that the second beam intersects the first beam at the desired tip location.

23. The apparatus of claim 22, wherein the second light beam adjusting mechanism is arranged to selectively adjust the position of the second beam along a third axis relative to the probe card.

24. The apparatus of claim 23, wherein the automated control mechanism is in controlling communication with the second light beam position adjusting mechanism.

25. The apparatus of claim 13, further comprising an electrical contact plate, the electrical contact plate mounted for movement with respect to the table between a first position in which the electrical plate is positioned at a desired location of the tip of at least one of the needles and a second position spaced from the first position.

26. An apparatus for locating a tip of a needle on a probe card, the apparatus comprising:

a table for securing the probe card;

a light source for supplying a first beam of collimated light and a second beam of collimated light;

a first positioning mechanism, the first positioning mechanism adapted to selectively adjust a position of the first beam of collimated light along a first axis and a second axis relative to the table according to a set of desired tip location coordinates; and a second positioning mechanism, the second positioning mechanism adapted to selectively adjust a position of the second beam of collimated light along a first axis and a third axis relative to the table according to the set of desired tip location coordinates.

27. The apparatus of claim 26, wherein the first positioning mechanism comprises a first template having at least one aperture defined therethrough, the first template positioned between the light source and the probe card; and wherein the second positioning mechanism comprises a second template having at least one aperture defined therethrough, the second template positioned between the light source and the probe card.

28. The apparatus of claim 27, further comprising an electrical contact, the electrical contact positionable between a first position where the electrical contact is spaced at one coordinate of the set of a desired tip location coordinates with respect to the probe card and a second position spaced from the first position.

29. An apparatus for locating a tip of a needle on a probe card, the apparatus comprising:

a table for securing the probe card;

a laser source for producing a laser beam;

a beam splitter positioned to split the laser beam into a first laser beam and a second laser beam;

a first motor actuated reflector arranged to position the first laser beam along a first axis;

a second motor actuated reflector arranged to position the first laser beam along a second axis, the second axis perpendicular to the first axis;

a third motor actuated reflector arranged to position the second laser beam along the first axis;

a fourth motor actuated reflector arranged to position the second laser beam along a third axis, the third axis perpendicular to the first axis and the second axis; and a controller in controlling communication with the first motor actuated reflector, the second motor actuated reflector, the third motor actuated reflector and the fourth motor actuated reflector, wherein the controller comprises a general purpose computer programmed to iterate through a first pair of coordinates of a set of three dimensional position data and a second pair of coordinates of the set of three dimensional position data corresponding to a desired tip position that is different from an actual tip position.

* * * * *